(12) United States Patent
Yanagi

(10) Patent No.: US 9,661,718 B2
(45) Date of Patent: May 23, 2017

(54) METHOD FOR PRODUCING ORGANIC EL PANEL AND DEVICE FOR SEALING ORGANIC EL PANEL

(75) Inventor: Yuji Yanagi, Tokyo (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 261 days.

(21) Appl. No.: 14/358,473

(22) PCT Filed: Dec. 19, 2011

(86) PCT No.: PCT/JP2011/079304
§ 371 (c)(1),
(2), (4) Date: May 15, 2014

(87) PCT Pub. No.: WO2013/073067
PCT Pub. Date: May 23, 2013

(65) Prior Publication Data
US 2014/0311668 A1    Oct. 23, 2014

(30) Foreign Application Priority Data

Nov. 17, 2011   (JP) .................. 2011-251500

(51) Int. Cl.
H05B 33/10    (2006.01)
H01L 51/52    (2006.01)
H01L 51/56    (2006.01)

(52) U.S. Cl.
CPC ......... H05B 33/10 (2013.01); H01L 51/5246 (2013.01); H01L 51/5259 (2013.01); H01L 51/56 (2013.01); *H01L 51/525* (2013.01)

(58) Field of Classification Search
CPC . H01L 51/5246; H01L 51/5259; H01L 51/56; H05B 33/10
See application file for complete search history.

(56) References Cited

U.S. PATENT DOCUMENTS 5,629,787 A  *  5/1997  Tsubota ................ G02F 1/1339
                                                                    349/153
6,280,559 B1    8/2001  Terada et al.
(Continued)

FOREIGN PATENT DOCUMENTS

CN    1395133    2/2003
CN    1575055    2/2005
(Continued)

OTHER PUBLICATIONS

Office Action issued Sep. 25, 2015 in corresponding Chinese patent application No. 201180074852.X (with English translation).
(Continued)

*Primary Examiner* — Daniel McNally
(74) *Attorney, Agent, or Firm* — Wenderoth, Lind & Ponack, L.L.P.

(57) ABSTRACT

A method for producing an organic EL panel includes an application step of applying a filler, a desiccant, a sealant and a fixing agent to positions on a encapsulation substrate opposing the position of an element, a positioning step of positioning an element substrate and the encapsulation substrate, a heating step of heating the encapsulation substrate, a defoaming step of removing gases incorporated within the filler and the like, a sticking substrates step of sticking the element substrate and the encapsulation substrate using a pair of surface plates, a gas introduction step of returning the periphery around the pressure welded element substrate and encapsulation substrate to an atmospheric pressure environment, a provisional fixing step of irradiating ultraviolet rays onto the fixing agent, and a seal curing step of irradiating ultraviolet rays onto the sealant, thereby curing the sealant.

15 Claims, 8 Drawing Sheets

(56) References Cited

U.S. PATENT DOCUMENTS

| | | | |
|---|---|---|---|
| 2005/0140291 A1* | 6/2005 | Hirakata | H01L 27/3211 313/512 |
| 2005/0225238 A1 | 10/2005 | Yamazaki | |
| 2006/0027318 A1* | 2/2006 | Hashizume | B32B 38/1841 156/285 |
| 2006/0186110 A1* | 8/2006 | Campello | H01L 21/67103 219/444.1 |
| 2007/0057295 A1 | 3/2007 | Lee et al. | |
| 2008/0054785 A1* | 3/2008 | Hayashi | B29C 65/14 313/483 |
| 2011/0177261 A1* | 7/2011 | Ishii | G02F 1/133308 428/1.5 |
| 2011/0242792 A1 | 10/2011 | Choi | |

FOREIGN PATENT DOCUMENTS

| | | | |
|---|---|---|---|
| CN | 1703123 | 11/2005 | |
| CN | 101136428 | 3/2008 | |
| CN | 101488471 | 7/2009 | |
| CN | 101997089 | 3/2011 | |
| EP | 1 585 175 | 10/2005 | |
| JE | 2009-176756 | 8/2009 | |
| JP | 54128289 A * | 10/1979 | |
| JP | 06102505 A * | 4/1994 | |
| JP | 11-121170 | 4/1999 | |
| JP | 11121170 A * | 4/1999 | |
| JP | 2002-216958 | 8/2002 | |
| JP | 2002-289587 | 10/2002 | |
| JP | 2003-187962 | 7/2003 | |
| JP | 2005-209631 | 8/2005 | |
| JP | 2005-243413 | 9/2005 | |
| JP | 2005-317273 | 11/2005 | |
| JP | 2006-119286 | 5/2006 | |
| JP | 2007-73459 | 3/2007 | |
| JP | 2008-7695 | 1/2008 | |
| JP | 2008007695 A * | 1/2008 | |
| JP | WO 2010001831 A1 * | 1/2010 | H01L 51/5237 |
| JP | 2011-040182 | 2/2011 | |
| TW | 201001621 | 1/2010 | |
| WO | 2010/001831 | 1/2010 | |

OTHER PUBLICATIONS

Notice of Allowance was issued Oct. 2, 2015 in corresponding Korean patent application No. 2014-7012884.
Extended European Search Report issued Dec. 4, 2015 in corresponding European patent application No. 11875901.8.
Decision to Grant a Patent issued Jun. 10, 2015 in corresponding Taiwanese patent application No. 100148984.
Office Action issued Nov. 17, 2014 in corresponding Taiwanese patent application No. 100148984 (with English translation).
International Search Report issued Mar. 19, 2012 in International Application No. PCT/JP2011/079304.
Written Opinion of the International Searching Authority issued Mar. 19, 2012 in International Application No. PCT/JP2011/079304.
Notification of Grant of Invention Patent issued Apr. 26, 2016 in Chinese patent application No. 201180074852.X (with English translation).

* cited by examiner

METHOD FOR PRODUCING ORGANIC EL PANEL AND DEVICE FOR SEALING ORGANIC EL PANEL

TECHNICAL FIELD

The present invention relates to a method for producing an organic EL panel and a device for sealing an organic EL panel.

BACKGROUND ART

Organic EL elements are extremely susceptible to moisture and the like, and in order to ensure a satisfactory lifespan for an organic EL element, the organic EL element must be isolated and protected from atmospheric moisture and the like. As a result, a step known as sealing is essential in the production of organic EL panels.

In a conventional sealing step, a encapsulation substrate such as a metal cap or a sealing glass having an internal space provided therein is used to form an airtight seal at a sealing portion. A desiccant or drying sheet which adsorbs moisture is housed inside the internal space, and absorbs any moisture or the like which permeates through the peripheral sealing portion. This sealing method is also known as hollow sealing, and is applicable to small organic EL elements.

However, if hollow sealing is applied to a large organic EL element, then a problem arises in that the encapsulation substrate may contact the organic EL element within the hollow portion, thereby damaging the organic EL element.

Further, in the case of organic EL elements used for illumination, a large amount of heat is generated during light emission, and the internal temperature of the panel increases. As a result, uneven brightness occurs due to a temperature distribution across the panel surface, and in the worst case, thermal runaway can result in element failure. Moreover, another problem is that the increase in the panel temperature accelerates deterioration in the brightness of the organic EL element, resulting in a shortening of the operating life. Accordingly, an entirely solid sealing technique which does not have an internal sealed space is required.

Hence, there is a need for a sealing method which, even for large panels, can protect the organic EL element from atmospheric moisture to ensure a good lifespan, while also ensuring there is no contact between the element substrate and the encapsulation substrate, and a sealing method which can transmit heat to both the element substrate and the encapsulation substrate, enabling heat dissipation and uniform heating. In order to address the above problems, a method has been proposed in which a filler is disposed between the element substrate and the encapsulation substrate (see Patent Document 1).

In Patent Document 1, a sealant is disposed around the outermost periphery of the element on the element substrate, a desiccant is provided inside the sealant, and a filler is disposed on top of the element. A encapsulation substrate is positioned facing the element substrate, the two substrates are pressure welded under reduced pressure, and the sealant is then cured.

CITATION LIST

Patent Literature

{PTL 1} Japanese Unexamined Patent Application, Publication No. 2007-73459 (Claim 1)

SUMMARY OF INVENTION

Technical Problem

In Patent Document 1, the sealant, the desiccant and the filler are all disposed on top of the element, but this can cause element faults.

Further, although not specified clearly in Patent Document 1, curing of the sealant is generally performed by ultraviolet irradiation across the entire surface, and in this method, the sticking substrates and curing must be performed as a continuous single step, but this requires considerable time, causing a lengthening of the takt time. Further, with simple sticking substrates, maintaining the parallelism between the element substrate and the encapsulation substrate is difficult, which can cause damage to the element. Further, when performing sealing of substrates having different panel sizes, the ultraviolet radiation cut mask must be changed at the time of ultraviolet curing, and this setup change takes time, causing a reduction in the productivity. Moreover, if the load (applied pressure) during sticking substrates is too large, then element damage may result.

The present invention has been developed in light of the above circumstances, and has an object of providing a method for producing an organic EL panel and a device for sealing an organic EL panel which suppress damage of the organic EL element during sticking substrates, shorten the time required for sticking substrates and curing, and enable setup changes to be performed with ease.

Solution to Problem

In order to address the above problems, a method for producing an organic EL panel and a device for sealing an organic EL panel according to the present invention employ the following solutions.

A first aspect of the present invention provides a method for producing an organic EL panel in which a sealing layer is interposed with no gaps between an element substrate on which an organic EL element is formed and a flat encapsulation substrate, the method comprising an application step of independently applying a filler, a desiccant, a sealant which is composed of an ultraviolet-curable resin and is disposed so as to surround the filler and the desiccant, and a fixing agent composed of an ultraviolet-curable resin to positions on the encapsulation substrate opposing the position of the organic EL element in an inert environment in which the moisture content is less than a prescribed value; a positioning step of transporting the element substrate and the encapsulation substrate to a bonding chamber, and positioning the element substrate and the encapsulation substrate in mutually separated positions; a heating step of heating the encapsulation substrate to which the filler, the desiccant, the sealant and the fixing agent have been applied; a defoaming step of placing the bonding chamber under vacuum, and removing gases incorporated within the filler, the desiccant, the sealant and the fixing agent; a sticking substrates step of sandwiching the element substrate and the encapsulation substrate between a pair of surface plates, applying a prescribed load to the pair of surface plates to pressure weld the element substrate and the encapsulation substrate together, and controlling the load so that an internal region surrounded by the sealant is filled with the filler and the desiccant, thus forming a sealing layer of a prescribed thickness between the element substrate and the encapsulation substrate; a gas introduction step of introducing an inert gas into the bonding chamber, and returning the periphery around the pressure welded element substrate and encapsulation substrate to an atmospheric pressure environment; a provisional fixing step of irradiating ultraviolet rays from the rear surface of the surface plate onto the fixing agent using a spot-type ultraviolet lamp, thereby curing the fixing agent and provisionally fixing the element substrate and the encapsulation substrate; and a seal curing step of irradiating ultraviolet rays onto the sealant applied to the substrates that have been provisionally fixed in the provisional fixing step, thereby curing the sealant.

Because organic EL elements are extremely susceptible to moisture and the like, the production of the organic EL panel is conducted in an inert environment in which the moisture content is less than a prescribed value. The filler, the desiccant, the sealant and the fixing agent are each applied independently to the encapsulation substrate. By heating the encapsulation substrate, the filler, the desiccant, the sealant and the fixing agent applied to the encapsulation substrate undergo a decrease in viscosity. As a result, gases are more easily removed in the subsequent defoaming step, and physical damage to the organic EL element caused by the application of the prescribed load in the sticking substrates step can be suppressed. Further, in the present invention, following the gas introduction step, ultraviolet rays are irradiated onto the fixing agent using a spot-type ultraviolet lamp. By using a spot-type ultraviolet lamp, the ultraviolet rays can be irradiated onto only the desired region. As a result, the radiation intensity of the ultraviolet rays can be strengthened, while suppressing any adverse effects such as the introduction of heat into the organic EL element, meaning the time required for provisional fixing of the element substrate and the encapsulation substrate can be shortened. Following provisional fixing of the element substrate and the encapsulation substrate with the fixing agent, a state is reached in which the organic EL element is sealed tightly by the filler, the desiccant and the sealant, and therefore the subsequent seal curing step can be performed in a normal environment such as a clean room. As a result, the production efficiency can be improved.

The first aspect described above may include a pressure adjustment step of introducing an inert gas into the bonding chamber, and adjusting the pressure inside the bonding chamber to a value of at least 50 Pa but not more than 500 Pa in order to eliminate foaming of the filler, the desiccant, the sealant and the fixing agent, wherein the sticking substrates step is performed after this pressure adjustment step.

By placing the bonding chamber under vacuum, gases incorporated within the filler, the desiccant, the sealant and the fixing agent can be removed. However, performing the sticking substrates step in a state where foaming is still continuing is undesirable from the viewpoint of retaining the shapes of the applied materials. Further, if a vacuum state continues to be maintained, then there is a possibility that additives and low-molecular weight components and the like may evaporate together with the gases. By including the pressure adjustment step prior to the sticking substrates step in the aforementioned first aspect, foaming can be eliminated, and the loss of material components from the filler, the desiccant, the sealant and the fixing agent can be suppressed, meaning the desired material performance levels can be maintained.

In the first aspect described above, in the application step, a desiccant comprising at least 10% by weight but not more than 50% by weight of a zeolite or calcium oxide having a particle size of not more than 4 µm in a resin or a high-viscosity oil, and having a viscosity at room temperature of at least 10 Pa·s but not more than 100 Pa·s, may be used as the desiccant.

By including a desiccant composed of a zeolite or calcium oxide within the desiccant, moisture which permeates through the sealant can be absorbed. The zeolite or calcium oxide is preferably mixed in a weight ratio of at least 10% but not more than 50%, and this enables the life of the organic EL element to be maintained for the desired period. The zeolite or calcium oxide used is composed of microparticles that are significantly smaller than the thickness of the sealing layer. The particle size of the zeolite or calcium oxide is typically not more than 4 µm, and preferably 1 µm or smaller. As a result, the desiccant can be prevented from damaging the organic EL element when the element substrate and the encapsulation substrate are pressure welded. The desiccant applied to the encapsulation substrate preferably undergoes no change in the applied shape during the application step. On the other hand, if the time required for the sticking substrates step is considered, then the viscosity of the desiccant is preferably not too high. Accordingly, the viscosity of the desiccant in the application step is preferably within a range from 10 Pa·s to 100 Pa·s.

In the first aspect described above, in the application step, a filler having a viscosity at room temperature of at least 10 Pa·s but not more than 100 Pa·s may be applied as intermittent straight lines which are applied in parallel with a spacing therebetween, or as a helical shape with an equal spacing therein.

By applying the filler as intermittent parallel straight lines with a spacing therebetween, or in a helical shape with an equal spacing therein, a layer of the filler having no gaps can be formed more easily when the filler is spread out by the sticking substrates.

In the first aspect described above, in the application step, the filler may be applied so that a spread ratio P/R between the diameter R of an applied bead of the filler and the application pitch P is within a range from at least 8 to not more than 32.

The amount of the filler applied is large, and therefore from the viewpoint of productivity, a large application diameter R is preferably formed at a large pitch P, with the filler being spread over a broad area. However, if spreading is performed over a broad area, then a large load must be applied during sticking substrates, and a long sticking substrates time is required. In the first aspect, by setting the spread ratio P/R between the diameter R of the applied bead of the filler and the application pitch P to at least 8 but not more than 32, the filler can be spread efficiently without requiring an overly large sticking substrates load.

In the first aspect described above, in the application step, the desiccant may be applied in a position such that the spread width of the desiccant following sticking substrates is within the region from the inner peripheral edge of the sealant to the outer peripheral edge of the light emission of the organic EL element.

By performing application in this manner, the desiccant comprising the desiccant does not make direct contact with the light emission surface of the organic EL element, and therefore the desiccant cannot damage the organic EL element.

In the first aspect described above, in the application step, a desiccant may be used as the filler.

By using a desiccant, so that the filler exhibits moisture absorption properties, moisture which permeates through the sealant can be better absorbed. As a result, the life of the organic EL element can be better maintained.

In the first aspect described above, in the application step, a sealant composed of an ultraviolet-curable epoxy resin comprising a spacer of at least 10 μm but not more than 100 μm may be applied so as to surround the outer periphery of the light emission surface of the organic EL element, thereby specifying the spacing between the element substrate and the encapsulation substrate in the sticking substrates step.

Epoxy resins have a low water permeation rate, and are therefore ideal as the sealant. Further, by including a spacer within the sealant to specify the spacing between the element substrate and the encapsulation substrate, damage of the organic EL element by the pressure applied during the sticking substrates step can be suppressed.

In the first aspect described above, in the application step, a fixing agent composed of an ultraviolet-curable resin comprising a spacer of at least 10 μm but not more than 100 μm may be applied intermittently around the periphery of the light emission surface of the organic EL element or around the periphery of the element substrate, thereby specifying the spacing between the element substrate and the encapsulation substrate in the sticking substrates step.

By including a spacer within the fixing agent to specify the spacing between the element substrate and the encapsulation substrate, damage of the organic EL element by the pressure applied during the sticking substrates step can be suppressed.

In the first aspect described above, the temperature of the encapsulation substrate in the heating step may be controlled within a range from at least 40° C. to not more than 80° C.

The filler, the desiccant, the sealant and the fixing agent have a property wherein the viscosity decreases as the temperature increases. According to the first aspect, described above, by controlling the temperature of the encapsulation substrate to at least 40° C. but not more than 80° C., and preferably at least 40° C. but not more than 60° C., the fluidity of the filler, the desiccant, the sealant and the fixing agent can be improved. As a result, when pressure is applied in the sticking substrates step, the filler, the desiccant, the sealant and the fixing agent can be spread with a lower load.

Further, a second aspect of the present invention is a device for sealing an organic EL panel in which a sealing layer is interposed with no gaps between an element substrate on which an organic EL element is formed and a flat encapsulation substrate, the device comprising an application means which applies a filler, a desiccant and a sealant which constitute a sealing layer, and a fixing agent to the encapsulation substrate with a dispenser, an airtight sealing means which can isolate a bonding chamber from the external environment; an evacuation means which evacuates the inside of the bonding chamber; a gas introduction means which can control the pressure inside the bonding chamber by introducing an inert gas; a positioning means which positions the element substrate and the encapsulation substrate in mutually separated positions; a heating means which heats the encapsulation substrate to which the filler, the desiccant, the sealant and the fixing agent have been applied; a sticking substrates means which is composed of a pair of metal surface plates and can control a load under a vacuum environment; a provisional fixing means which provisionally fixes the element substrate and the encapsulation substrate by disposing a spot-type ultraviolet lamp at the rear surface of the metal surface plate and curing the fixing agent by irradiation with ultraviolet rays; and a seal curing means which cures the sealant by irradiation with ultraviolet rays.

According to the second aspect described above, by using surface plates formed from metal, a high degree of planarization polishing can be achieved. By improving the degree of flatness of the surface plates, the thickness of the sealing layer comprising the filler, the desiccant and the sealant can be made more uniform, enabling the production of a high-quality organic EL panel. Further, metal surface plates are thin and electrically conductive, meaning they suffer extremely little electrostatic buildup, and also offer the advantage of being cheap to produce.

According to the second aspect described above, by using a dispenser to apply the filler, the desiccant, the sealant and the fixing agent, a setup change can be achieved by simply selecting a drawing program. As a result, when the size or the like of the organic EL element is changed, the device can immediately adapt. Further, by using a dispenser, the filler, the desiccant, the sealant and the fixing agent can be applied continuously.

According to the second aspect described above, by using the evacuation means to place the inside of the bonding chamber in a state of vacuum, gases incorporated within the filler, the desiccant, the sealant and the fixing agent can be removed.

According to the second aspect described above, by heating the encapsulation substrate with the heating means, the viscosities of the filler, the desiccant, the sealant and the fixing agent can be reduced. As a result, gases incorporated within the filler, the desiccant, the sealant and the fixing agent can be removed more easily. Further, spreading becomes easier when pressure is applied by the sticking substrates means, and therefore physical damage to the organic EL element caused by the application of a load can be suppressed.

According to the second aspect described above, by disposing the spot-type ultraviolet lamp at the rear surface of the metal surface plate, the fixing agent can be selectively irradiated with ultraviolet rays. As a result, the radiation intensity of the ultraviolet rays can be strengthened, while suppressing any adverse effects on the organic EL element, and therefore the time required for fixing the element substrate and the encapsulation substrate can be shortened.

The organic EL element is covered with the filler and the desiccant, and surrounded by the sealant, and therefore following provisional fixing of the element substrate and the encapsulation substrate, the organic EL element is in an airtight sealed state. Accordingly, curing of the sealant can be performed in a separate step from the fixing of the element substrate and the encapsulation substrate. As a result, the production efficiency can be improved.

In the second aspect described above, the heating means may be composed of a surface heater and a thermocouple disposed on the rear surface of the metal surface plate on the side of the encapsulation substrate, meaning the temperature of the encapsulation substrate can be controlled at the desired temperature.

By disposing a surface heater and a thermocouple on the rear surface of the metal surface plate, the heat of the heater is transmitted to the encapsulation substrate upon contact of the encapsulation substrate with the metal surface plate, enabling the temperature of the encapsulation substrate to be adjusted to the desired temperature.

In the second aspect described above, the airtight sealing means may have, inside the bonding chamber, an inner chamber which can seal only the metal surface plates, the element substrate and the encapsulation substrate.

By including an inner chamber, the volume surrounding the metal surface plates, the element substrate and the encapsulation substrate can be reduced. As a result, the evacuation and venting times can be shortened.

In the second aspect described above, the sticking substrates means may comprise an elastic sheet, which is disposed on the substrate-side surface of the surface plate on the side of the element substrate, has a thickness of at least 0.1 mm but not more than 1.0 mm, and exhibits conductivity.

By providing an elastic sheet, any deviations in the degree of flatness of the surface plate can be absorbed. As a result, a sealing layer of more uniform thickness can be ensured, meaning the quality and yield of the organic EL panel can be improved. Further, because the elastic sheet exhibits conductivity, electrostatic buildup can be suppressed.

In the second aspect described above, the sticking substrates means may comprise a vacuum suction mechanism disposed on the surface plate on the side of the encapsulation substrate.

By providing a vacuum suction mechanism, the surface plate and the encapsulation substrate can be held together more tightly, and the heat conduction efficiency from the surface plate to the encapsulation substrate can be enhanced. As a result, the viscosities of the filler, the desiccant, the sealant and the fixing agent can be reduced in a shorter time, and therefore the sticking substrates time can be shortened. Further, because the viscosity of the filler and the like can be lowered satisfactorily prior to sticking substrates, damage to the organic EL element caused by the sticking substrates can be suppressed.

In the second aspect described above, the sticking substrates means may comprise a gas pressurization mechanism and a gas pressure adjustment mechanism disposed on the surface plate on the side of the element substrate.

According to the second aspect described above, because the surface plate on the side of the element substrate can be pressurized using a gas, a uniform load can be applied to the element substrate. As a result, even if the degrees of flatness of the substrate and the surface plate include deviations or deformations, a sealing layer of more uniform thickness can be obtained.

Advantageous Effects of Invention

In the present invention, by providing a heating step, damage of the organic EL element during sticking substrates can be suppressed, and the time required for sticking substrates and curing can be shortened. Further, by separating the provisional fixing step and the seal curing step, the time required for sticking substrates and curing can be shortened, and a method for producing an organic EL panel and a device for sealing an organic EL panel which enable simple setup changes can be achieved.

DESCRIPTION OF EMBODIMENTS

An embodiment of the method for producing an organic EL panel and the device for sealing an organic EL panel according to the present invention is described below with reference to the drawings.
(First Embodiment)

Figure 1:
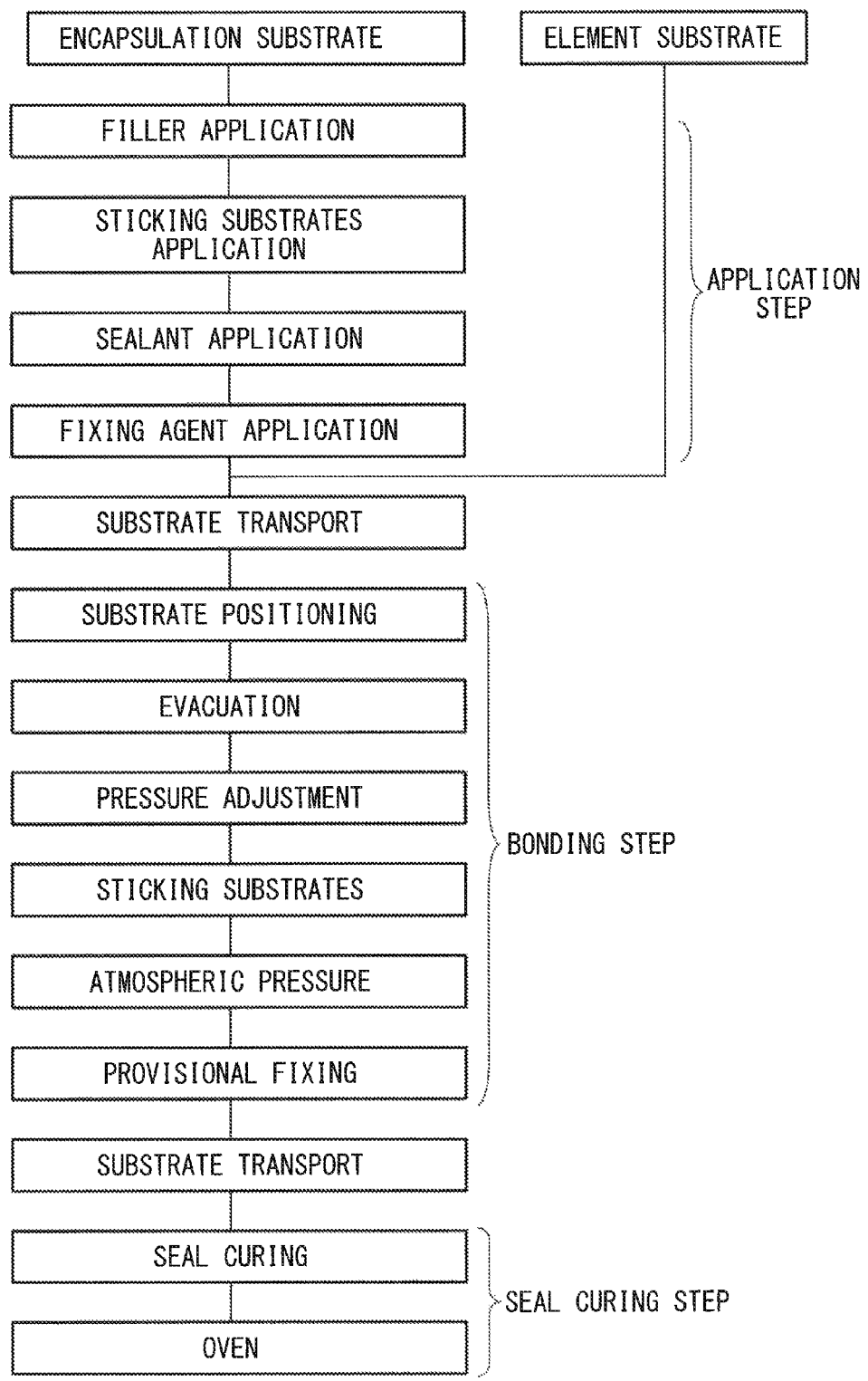
FIG. 1 A diagram illustrating the sealing treatment sequence in a method for producing an organic EL panel in a first embodiment.
Figure 2:
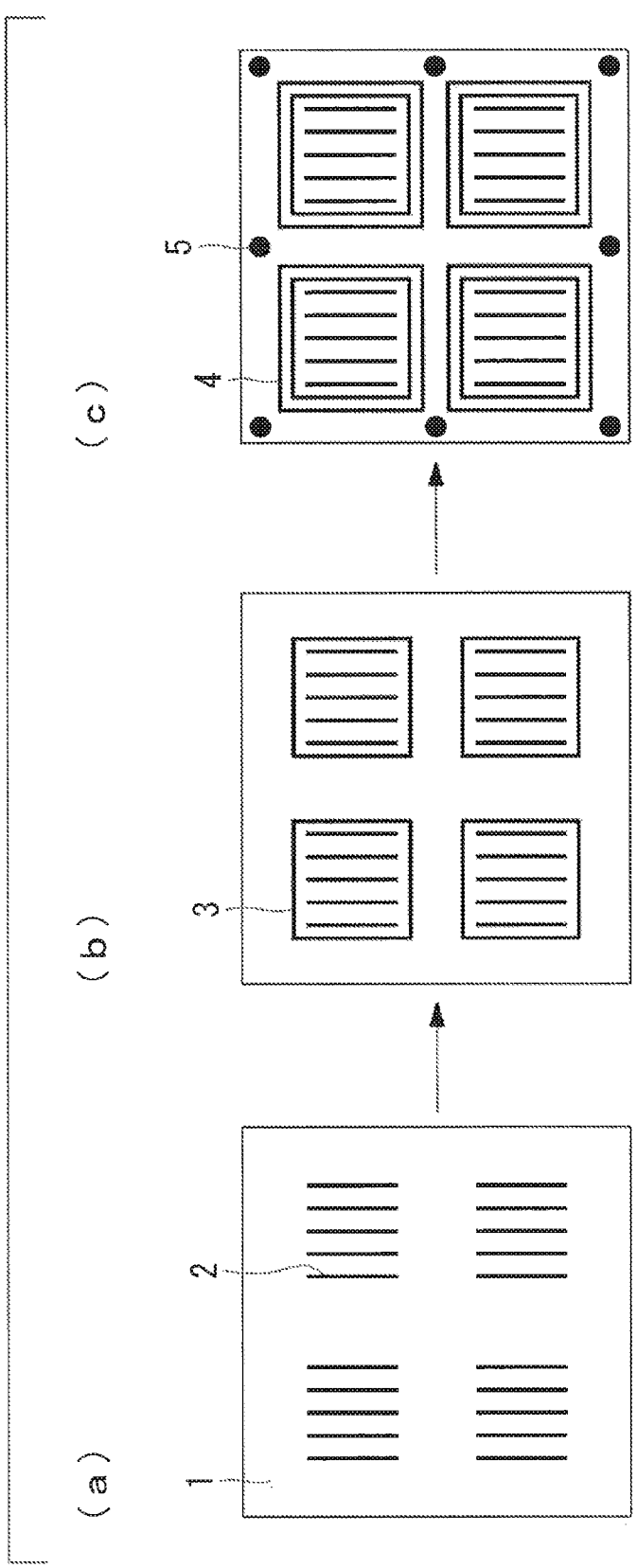
FIG. 2 A diagram illustrating an example of application to a encapsulation substrate.
Figure 3:
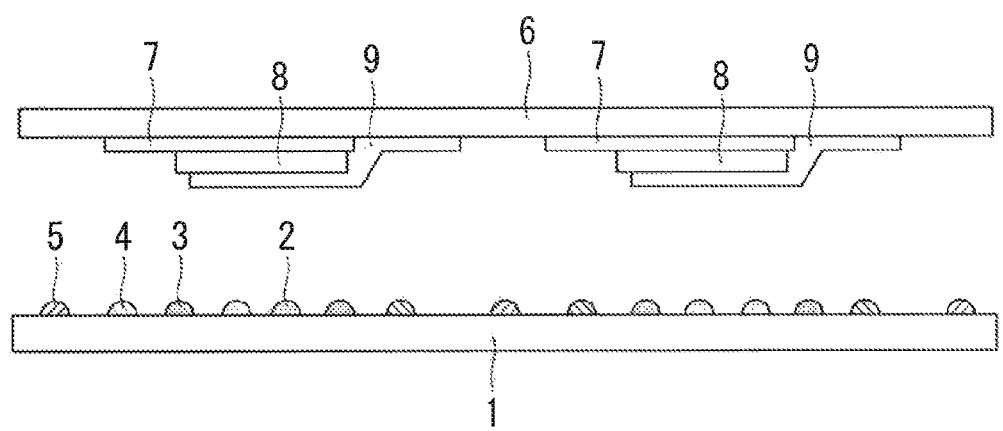
FIG. 3 A schematic cross-sectional view of a positioned element substrate and encapsulation substrate.
Figure 4:
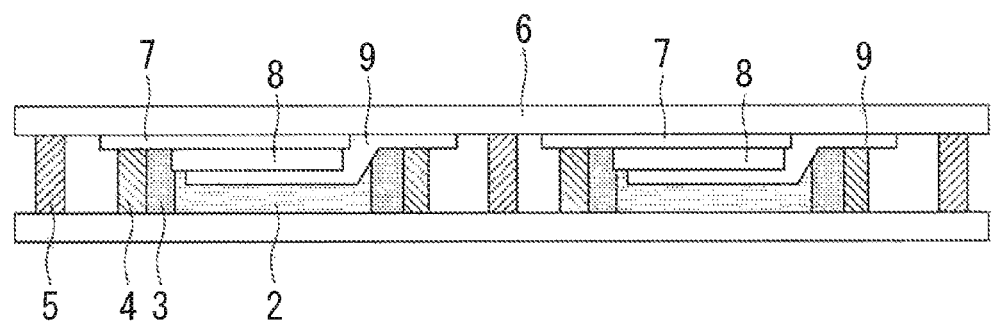
FIG. 4 A cross-sectional view of an organic EL panel following sealing in the first embodiment.
Figure 5:
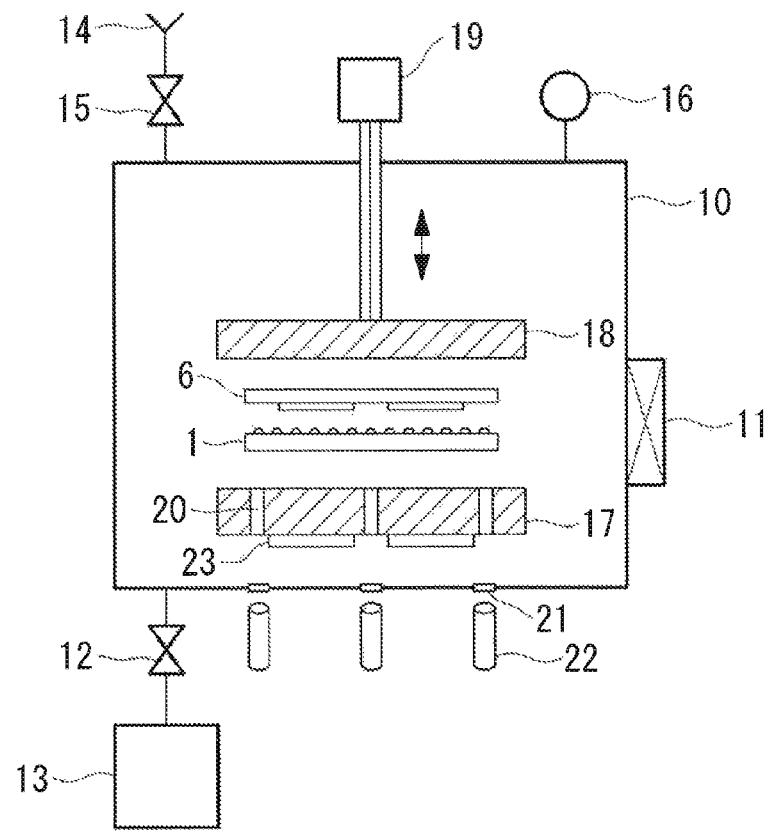
FIG. 5 A schematic cross-sectional view of a sealing device according to the first embodiment.

FIG. 1 is a diagram illustrating the sealing treatment sequence in the method for producing an organic EL panel according to this embodiment. FIG. 2 is a diagram illustrating an example of application to the encapsulation substrate. FIG. 3 is a schematic cross-sectional view of the positioned element substrate and encapsulation substrate. FIG. 4 is a cross-sectional view of the organic EL panel following sealing. FIG. 5 is a schematic structural view of the sealing device.

An organic EL panel sealed and produced using the present embodiment has a structure in which a sealing layer is interposed with no gaps between an element substrate on which an organic EL element is formed and a flat encapsulation substrate.

The element substrate 6 has an organic EL element, comprising an anode 7, an organic light emitting layer 8 and a cathode 9, formed on a flat glass substrate. The anode 7 is formed from a transparent conductive film (ITO) or the like, and is formed by patterning. The organic light emitting layer 8 is formed, for example, by using deposition to sequentially stack a hole injection layer, a hole transport layer, a light emitting layer, and electron transport layer and an electron injection layer. The cathode 9 is formed from an aluminum electrode or the like.

The organic EL element may be coated with a protective film (not shown in the drawings). The protective film is formed from silicon oxide ($SiO_2$), silicone nitride ($Si_3N_4$) or silicon oxynitride (SiON) or the like.

In the present embodiment, because film formation is performed by vapor deposition, the organic EL element is deposited on the lower surface of the element substrate, as illustrated in FIG. 3.

A flat glass substrate is used as the encapsulation substrate 1. Further, the encapsulation substrate 1 is preferably formed from a glass of the same quality and having the same thermal expansion coefficient as the element substrate 6. The degree of flatness of the encapsulation substrate 1 is typically equivalent to warping of approximately 0.2 to 0.4 mm, the same as that of a liquid crystal display.

The sealing layer according to the present embodiment is composed of a filler 2, a desiccant 3, a sealant 4 and a fixing agent 5.

The filler 2 is a curable resin, a non-curable resin, a gel-like resin or a high-viscosity oil. It is necessary that the filler undergoes no change in the applied shape during the application step. Accordingly, the viscosity of the filler is preferably high, but if consideration is also given to the application time and the sticking substrates time during the bonding step, then the viscosity of the filler 2 is preferably within a range from 10 Pa·s to 100 Pa·s.

The desiccant 3 exhibits a high level of moisture absorption. The desiccant 3 is composed of a medium such as a curable resin, a non-curable resin, a gel-like resin or a high-viscosity oil which contains a desiccant in a weight ratio of at least 10% but not more than 50%. By including an amount of the desiccant that satisfies this range, moisture which permeates through the sealant 4 can be absorbed, enabling the life of the organic EL element to be maintained. Although there are no particular limitations on the medium of the desiccant 3, because the desiccant 3 makes direct contact with the filler 2, it is desirable to use the same material as the filler 2. A zeolite or calcium oxide is ideal as the desiccant. The desiccant is composed of microparticles that are significantly smaller than the thickness of the sealing layer. The particle size of the desiccant is typically not more than 4 µm, and preferably 1 µm or smaller.

The sealant 4 is an ultraviolet-curable resin having low water permeability. The sealant 4 is preferably an ultraviolet-curable epoxy resin. The sealant 4 preferably comprises a spacer of at least 10 µm but not more than 100 µm. The spacer is typically a glass or plastic material, the shape may be spherical or columnar, and the diameter of the spacer is set to 12 µm or 50 µm or the like, thereby specifying the thickness of the sealing layer.

The fixing agent 5 is an ultraviolet-curable resin. The fixing agent 5 preferably has powerful adhesive strength, and can be cured in a short period of time. For example, the fixing agent 5 may be an acrylic adhesive or the like. The fixing agent 5 preferably comprises a spacer of at least 10 µm but not more than 100 µm. The fixing agent 5 may be the same material as the sealant 4.

The sealing device used in the present embodiment comprises an application means, an airtight sealing means, an evacuation means, a gas introduction means, a positioning means, a sticking substrates means, a heating means, a provisional fixing means, and a seal curing means.

The application means (not shown in the drawings) is a means of applying the filler 2, the desiccant 3, the sealant 4 and the fixing agent 5 to the encapsulation substrate 1 using a dispenser.

The airtight sealing means is a structure capable of isolating a bonding chamber 10 from the external environment. In FIG. 5, a gate valve 11 for introducing and discharging the substrates is provided in the bonding chamber 10.

An exhaust valve 12 and a vacuum pump 13 are connected to the bonding chamber 10 as the evacuation means. The evacuation means can evacuate the inside of the bonding chamber. A vent gas 14, a vent valve 15 and a pressure gauge 16 are connected to the bonding chamber 10 as the gas introduction means. The gas introduction means can control the pressure inside the bonding chamber by introducing an inert gas while detecting the internal pressure with the pressure gauge 16. The vent gas 14 is an inert gas having a moisture content lower than a prescribed value. For example, the vent gas 14 may be nitrogen gas having a moisture concentration of 1 ppm or less.

The positioning means does not require high-precision CCD camera alignment such as that required for displays, and may use mechanical alignment or the like based on aligning the edges of the glass substrates to approximately ±100 µm, thus positioning the element substrate 6 and the encapsulation substrate 1 in mutually separated positions.

The sticking substrates means is composed of a pair of surface plates (a lower surface plate 17 and an upper surface plate 18) disposed inside the bonding chamber, and is capable of controlling the load applied under vacuum conditions. The lower surface plate 17 and the upper surface plate 18 are disposed in parallel so as to enable sticking substrates of the element substrate 6 and the encapsulation substrate 1. The surface plates are preferably formed from a conductive metal such as steel. The surfaces of the lower surface plate 17 and upper surface plate 18 which contact the encapsulation substrate 1 and the element substrate 6 respectively are polished flat. In the present embodiment, a lift mechanism 19 is connected to the upper surface plate 18, and the load is controlled by raising and lowering the upper surface plate 18 using this lift mechanism 19. Alternatively, the lower surface plate 17 rather than the upper surface plate 18 may be configured as the movable surface plate.

UV transmission holes 20 which penetrate through the lower surface plate 17 are provided in the lower surface plate 17. The UV transmission holes 20 are disposed appropriately in positions which enable selective irradiation of the fixing agent 5 with ultraviolet rays. UV transmission windows 21 are provided in the wall of the bonding chamber 10. The UV transmission windows 21 are disposed in positions which enable ultraviolet rays from spot-like ultraviolet lamps 22 to be irradiated from the rear surface side of the lower surface plate 17, through the UV transmission holes 20, and onto the fixing agent. The spot-like ultraviolet lamps 22 are disposed outside the bonding chamber. The provisional fixing means comprising the UV transmission holes 20, the UV transmission windows 21 and the spot-like ultraviolet lamps 22 may also be positioned on the side of the upper surface plate.

The heating means comprises a heater 23 and a thermocouple or the like, and can heat and control the temperature of the encapsulation substrate 1 at a desired temperature. In FIG. 5, the surface heater 23 and the thermocouple are disposed in direct contact with the rear surface (the opposite surface from the surface which contacts the substrate) of the lower surface plate 17. This heating means heats the lower surface plate 17 directly, and by bringing the encapsulation substrate 1 into contact with the lower surface plate 17, also indirectly controls the heating of the encapsulation substrate 1.

The seal curing means (not shown in the drawings) is disposed outside the bonding chamber 10, and is a means for curing the sealant by irradiation with ultraviolet rays.

Next is a description of the method for producing an organic EL panel according to the present embodiment. As illustrated in FIG. 1, the method for producing an organic EL panel according to the present embodiment is composed of an application step, a bonding step, and a seal curing step.

(Application Step)

The filler 2, the desiccant 3, the sealant 4 and the fixing agent 5 are applied sequentially to the encapsulation substrate 1. The application is performed in an inert environment in which the moisture content is lower than a prescribed value. The prescribed value for the water content is set as appropriate in accordance with the standard of the organic EL panel being produced. For example, the inert environment may be a nitrogen atmosphere of atmospheric pressure with a moisture concentration of 1 ppm or less.

A dispenser is used for application of the filler 2, the desiccant 3, the sealant 4 and the fixing agent 5. Screen printing actually offers a higher level of productivity for applying the filler 2, but because a screen printing plate optimized for the panel shape and dimensions is used, the associated setup change requires time, and if a variety of products are being produced, the productivity deteriorates. Further, when a heat-curable resin is used as the filler 2, the viscosity increases over time, meaning changes in the applied thickness tend to be problematic. In contrast, when a dispenser is used, although each individual application exhibits reasonably poor productivity, setup changes can be made instantly by simply selecting the appropriate drawing program. Further, in the continuous application of the desiccant 3, the sealant 4 and the fixing agent 5 following application of the filler, screen printing cannot be used, and application by dispenser is essential. If the productivity is low, compensation can be made by installing a plurality of facilities. In such cases, facilities of the same type preferably exhibit favorable consistency. Examples of methods that can be used for improving the productivity include increasing the application speed, using a plurality of nozzles on the dispenser, using a plurality of nozzle heads, or using a plurality of dispensers.

FIG. 2 is an example of a 4-panel substrate comprising 4 organic EL elements formed on a substrate, which upon partitioning, yields 4 complete panels.

First, as illustrated in FIG. 2(a), the filler 2 is applied to positions on the encapsulation substrate corresponding with the organic EL elements. The filler 2 may be applied as intermittent straight lines, which are applied in parallel with a spacing therebetween, or as a helical shape with an equal spacing therein. The filler 2 is preferably applied so that a spread ratio P/R between the diameter R of the applied bead of the filler 2 and the application pitch P is within a range from at least 8 to not more than 32.

Next, as illustrated in FIG. 2(b), the desiccant 3 is applied around the outer periphery of the filler 2. Then, as illustrated in FIG. 2(c), the sealant 4 is applied so as to surround the filler 2 and the desiccant 3. Subsequently, the fixing agent 5 is applied around the outer periphery of the encapsulation substrate 1, or around the outer periphery of the sealant 4, either as dots or as a linear bead.

The desiccant 3 is preferably applied in a position such that the spread width following sticking substrates is within the region from the inner peripheral edge of the sealant 4 to the outer peripheral edge of the light emission of the organic EL element.

(Bonding Step)

The bonding step comprises a positioning step, a heating step, a defoaming step, a pressure adjustment step, a sticking substrates step, a gas introduction step, and a provisional fixing step.

(Positioning Step)

The element substrate 6 and the encapsulation substrate 1 are passed through the gate valve 11 and transported into the space between the lower surface plate 17 and the upper surface plate 18 inside the bonding chamber. The element substrate 6 and the encapsulation substrate 1 are disposed opposing one another, so that the surface on which the organic EL elements are formed and the surface to which the filler 2 and the like have been applied are facing each other, and the positioning means is then used to position the substrates in mutually separated positions. Although not shown in the drawings, the substrates are held in these separated positions by a holding mechanism, while the substrates are positioned using a positioning mechanism.

(Heating Step)

The lower surface plate 17 is heated in advance by the heating means to a temperature of 40° C. to 80° C., and preferably 40° C. to 60° C. As a result, when the encapsulation substrate 1 is brought into contact with the lower surface plate 17, heating can be started immediately.

Figure 6:
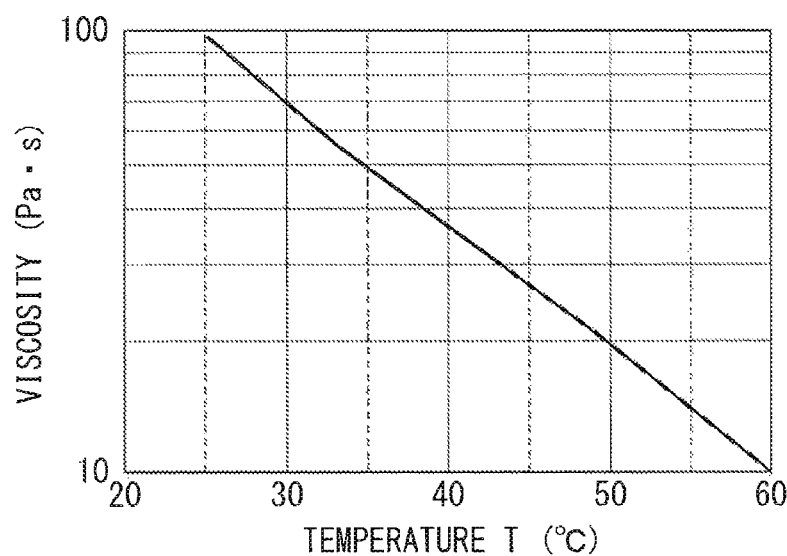
FIG. 6 A diagram illustrating the relationship between the viscosity of an applied material and the material temperature.

The grounds for setting the temperature range for the heating are described below. One example of measuring the relationship between the viscosity and the material temperature of the filler 2, the desiccant 3 or the sealant 4 is illustrated in FIG. 6. In the figure, the horizontal axis represents the temperature of the applied material, and the vertical axis represents the viscosity. An ultraviolet-curable epoxy-based adhesive having a high viscosity was used as the applied material. As illustrated in FIG. 6, when the temperature increased 10° C., the viscosity decreased by approximately ½. When an applied material having a viscosity of 100 Pa·s at room temperature of 25° C. was heated to 60° C., the viscosity decreased to 10 Pa·s, which represents a reduction to ¹⁄₁₀th of the initial viscosity and a marked increase in the fluidity. Accordingly, the temperature of the lower surface plate 17 is typically set within a range from 40 to 80° C., and preferably within a range from 40 to 60° C.

(Defoaming Step)

Following positioning of the element substrate 6 and the encapsulation substrate 1, the gate valve 11 is closed, the exhaust valve 12 is opened, and the vacuum pump 13 is used to evacuate the inside of the bonding chamber to a pressure of at least 10 Pa but not more than 50 Pa. By evacuating the inside of the bonding chamber, gases incorporated within the filler 2, the desiccant 3, the sealant 4 and the fixing agent 5 can be removed. However, in this pressure region, additives and low-molecular weight components contained within the filler 2, the desiccant 3 and the sealant 4 also continue to evaporate, causing continued foaming, which is undesirable in terms of material performance and shape retention. Accordingly, the defoaming step is performed for only a prescribed time, which is set in accordance with the materials used for the filler 2, the desiccant 3, the sealant 4 and the fixing agent 5. The prescribed time is, for example, approximately 10 to 60 seconds.

(Pressure Adjustment Step)

After the defoaming step, the exhaust valve 12 is closed, the vent valve 15 is opened, and the vent gas (inert gas) 14 is introduced into the bonding chamber. At this time, the pressure inside the bonding chamber is detected by the pressure gauge 16, and the pressure is controlled to a pressure of at least 50 Pa but not more than 500 Pa, and preferably at least 50 Pa but not more than 200 Pa. If the pressure inside the bonding chamber is set to 500 Pa, then when the pressure is returned to atmospheric pressure (100 kPa), gas bubbles incorporated in the filler 2 and the like reduce to ⁵⁄₁,₀₀₀th their original size. Further, even if some cavities are formed inside the sealed region during pressure bonding, the filler 2, the desiccant 3 and the sealant 4 are still in uncured states, and have at least some fluidity. As a result, when the pressure is returned to atmospheric pressure, because uniform pressurization at 100 kPa occurs, any cavities are shrunk to visually imperceptible size.

(Sticking Substrates Step)

Following the pressure adjustment step, the vent valve 15 is closed, the upper surface plate 18 is lowered, and the element substrate 6 and the encapsulation substrate 1 are brought into contact and pressure welded between the upper surface plate 18 and the lower surface plate 17. At this time, the lower surface plate 17 has already been heated by the heating means 23, and the temperature is controlled by a temperature controller which is not shown in the drawings. The encapsulation substrate 1 is heated by heat conduction through contact with the lower surface plate 17, thereby lowering the viscosities of the filler 2, the desiccant 3 and the sealant 4. As a result, the pressurization force required to spread the filler 2 and the like is reduced, meaning the sticking substrates time can be shortened, and the stress applied to the elements can be reduced.

The upper surface plate 18 is used to pressure weld the element substrate 6 and the encapsulation substrate 1 at a prescribed pressure for a prescribed time, thereby spreading the filler 2, the desiccant 3 and the sealant 4 with no gaps. For example, at a pressure of 5 kPa to 50 kPa, sticking substrates is performed for 15 to 60 seconds. The thickness of the sealing layer composed of the filler 2, the desiccant 3 and the sealant 4 is typically from 10 µm to 100 µm, and preferably from 20 µm to 50 µm.

(Gas Introduction Step)

Following the sticking substrates step, the vent valve 15 is opened, and the vent gas 14 is introduced to return the interior of the bonding chamber to atmospheric pressure.

(Provisional Fixing Step)

Following the gas introduction step, ultraviolet rays are irradiated from the spot-like ultraviolet lamps 22 to cure the fixing agent 5. For example, by using LED UV irradiation devices as the spot-like ultraviolet lamps 22 to obtain ultraviolet rays having a wavelength of 365 nm, a beam diameter of 5 mm, and an irradiation energy of 3 W/cm$^2$, even an ultraviolet-curable epoxy adhesive can be cured with 6 J, meaning the fixing agent 5 can be cured in several seconds.

(Seal Curing Step)

Following the provisional fixing step, the provisionally fixed substrates are passed through the gate valve 11 out of the bonding chamber 10, and are transported into a normal environment such as a clean room. If necessary, the provisionally fixed substrates are set on a simple UV cut mask holder, and the substrates are then transported along a general-purpose ultraviolet irradiation conveyor to cure the sealant 4. The curing of the sealant 4 may also be performed by moving the spot-like ultraviolet lamps 22 while they are being used to irradiate the sealant 4. In the substrates that have been provisionally fixed by the fixing agent 5, the sealant 4 is not completely cured, but the organic EL elements are covered with the filler 2 and the desiccant 3, and are therefore sealed in an airtight manner. As a result, even if the provisionally fixed substrates are placed in a general atmosphere containing moisture and particles, there is absolutely no effect on the organic EL elements.

Once the sealant 4 has been cured, the substrates are placed in an oven and after-cured, thereby completing the sealing process. When heat-curable resins are used for the filler 2 and the desiccant 3, curing is performed by placing the substrates in the oven.

Finally, the organic EL panels are completed by partitioning the bonded substrates.

According to the present embodiment, by providing the heating means 23, the viscosities of the filler 2, the desiccant 3 and the sealant 4 can be reduced, and therefore the load applied to the organic EL elements during sticking substrates can be reduced. As a result, element damage is reduced, and the yield improves. Further, a high-quality panel having no gas bubbles within the seal can be produced.

In conventional methods, curing of the sealant has been performed immediately after the sticking substrates step, and therefore it has been necessary to have the surface plate on at least one side formed from a quartz surface plate having ultraviolet transmittance. Quartz surface plates suffer various problems, including (1) being expensive, (2) being difficult to polish to a high degree of flatness, (3) having lower strength than steel or the like, and therefore being more prone to deformation during sticking substrates and evacuation, meaning processing the sealing layer uniformly is difficult, and (4) because the inside of the bonding chamber is a dry environment having a low moisture content, when sticking substrates of quartz glass substrates is performed, an extremely large detachment electrification due to static electricity occurs upon release, meaning the pressure welded substrates are attracted tightly to the surface plates, which can be very problematic.

According to the present embodiment, by separating the seal curing step and the provisional fixing step, the pair of surface plates can both be formed from metal. By forming both the upper and lower surface plates from a metal such as steel, surface plates having a high degree of flatness and minimal thickness can be prepared inexpensively. By improving the degree of flatness of the surface plates, the sealing thickness can be made more uniform, and a high-quality organic EL panel can be produced. Further, because metal surface plates have conductivity, they offer the advantage that electrostatic buildup is extremely minimal. As a result, the development of static electricity can be drastically reduced, thus reducing problems caused by static electricity.

Conventionally, metal halide lamps have been used as the ultraviolet radiation source for curing the sealant. Metal halide lamps generate a large amount of heat, and must be physically separated from the substrates to ensure the lamps have no thermal effects on the organic EL elements. Further, in order to ensure that the ultraviolet rays are irradiated uniformly over a broad area, the distance between the encapsulation substrate and the ultraviolet radiation source must be increased. However, as the distance between the encapsulation substrate and the ultraviolet radiation source is increased, the UV irradiation intensity per unit of surface area decreases. Because the curing energy for ultraviolet-curable epoxy resins is a very high value of 6,000 mJ or higher, in a conventional solid sealing process, the ultraviolet curing treatment of curing the sealant is the treatment which requires the longest time.

In the present embodiment, in the bonding step, because only the fixing agent is cured in a short period of time following sticking substrates, thereby provisionally fixing the element substrate and the encapsulation substrate, the substrates are able to be transported into a normal environment with the sealant still in an uncured state. Further, the sealant curing step, which requires considerable time, can be performed in a normal environment using a general-purpose UV curing device or heating device. As a result, batch processing using inexpensive equipment is possible.

Further, metal halide lamps generate a large amount of heat and also generate ozone, and therefore when used inside a clean room, a large amount of cooling air from an external air source separated from the clean room and ozone exhausting are required, which increases the size of the equipment.

According to the present embodiment, by separating the provisional fixing step and the seal curing step, the vacuum chamber can be reduced in size, and because ultraviolet rays are not irradiated onto the entire surface of the substrate, increase in the temperature of the substrate is eliminated. Further, the spot-like ultraviolet lamps can use light-guided irradiation using glass fiber, but LED ultraviolet lamps can also be used, and because ozone generation caused by unnecessary short-wavelength radiation such as that from metal halide lamps can be eliminated, the equipment can be reduced in size.

Further, in the sealant curing step, an ultraviolet curing mask has conventionally been required for each organic EL element shape. According to the present embodiment, by separating the seal curing step from the provisional fixing step, the use of an ultraviolet curing mask under a dry or vacuum environment is unnecessary, meaning setup changes need not be performed under dry or vacuum conditions. As a result, the time required for evacuation and vent gas introduction can be shortened, thus improving the productivity.

The grounds for setting the application diameter and application pitch of the applied materials are described below.

Figure 7:
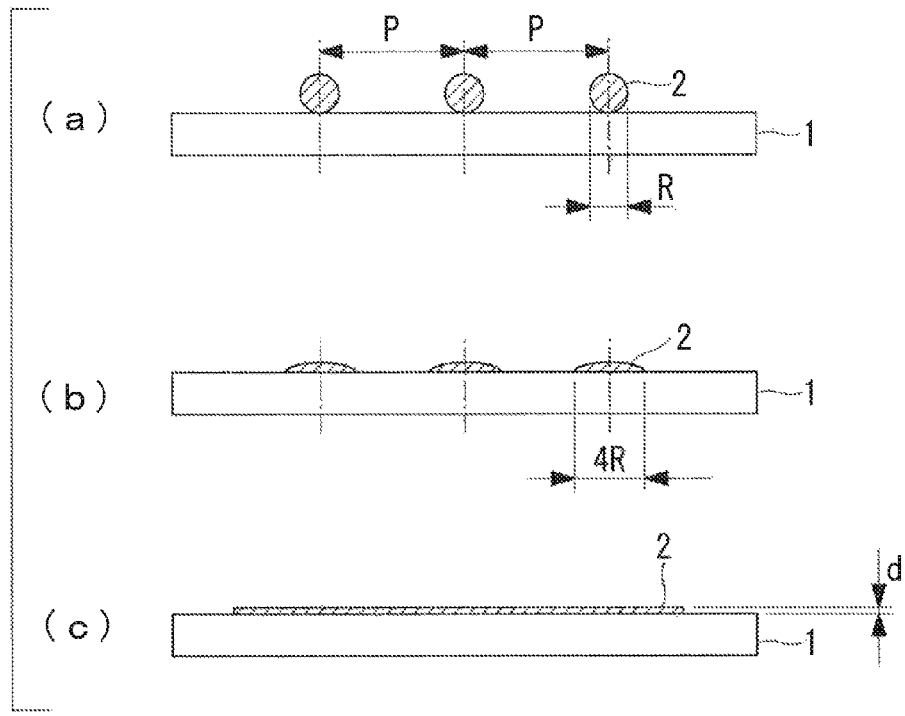
FIG. 7 A diagram illustrating cross-sectional views of application dimensions.

FIG. 7 illustrates cross-sectional views of the application dimensions, using the filler as an example. FIG. 7(a) is an assumed cross-sectional view showing the state immediately after application to the substrate 1 of beads of the filler 2 having a diameter R corresponding with the nozzle diameter at a pitch P. FIG. 7(b) is an assumed cross-sectional view of the state where, following application, the filler 2 has spread out in accordance with the relationship between the viscosity and the substrate surface wettability. Testing confirmed that filler 2 applied with a diameter R spread out 4-fold, resulting in a spread width 4R following application. FIG. 7(c) is an assumed cross-sectional view showing a state in which sticking substrates has caused even spreading with no gaps to form a sealing layer of thickness d.

In particular, from the viewpoint of productivity, application of the filler 2, which is applied in a large amount, is preferably applied with a large application diameter R at a broad pitch P. However, a larger load is required to achieve spreading over a wider distance, and a longer time is required for the sticking substrates time, meaning greater stress is placed on the elements. The sticking substrates time and the element stress are mutually opposing properties, and the balance between the two is important.

Figure 8:
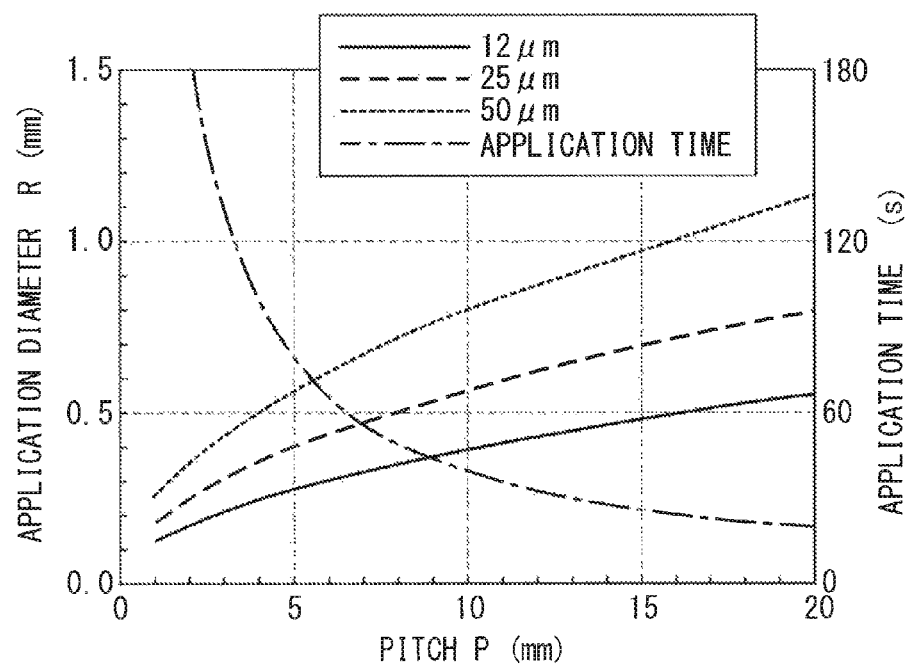
FIG. 8 A diagram illustrating the relationship between the application conditions and the application time.

FIG. 8 illustrates the relationship between the application conditions and the application time. In the figure, the horizontal axis represents the pitch P, the vertical axis (left) represents the application diameter R, and the vertical axis (right) represents the application time. The figure shows the results of calculating the application time for filler application conditions including an application area of 140 mm×140 mm, an application speed of 50 mm/s, and a sealing thickness d of 12, 25 or 50 µm. It was found that the application time decreases rapidly in the region where the pitch P is narrow, but decreases more gently in the region where the pitch is broad.

Figure 9:
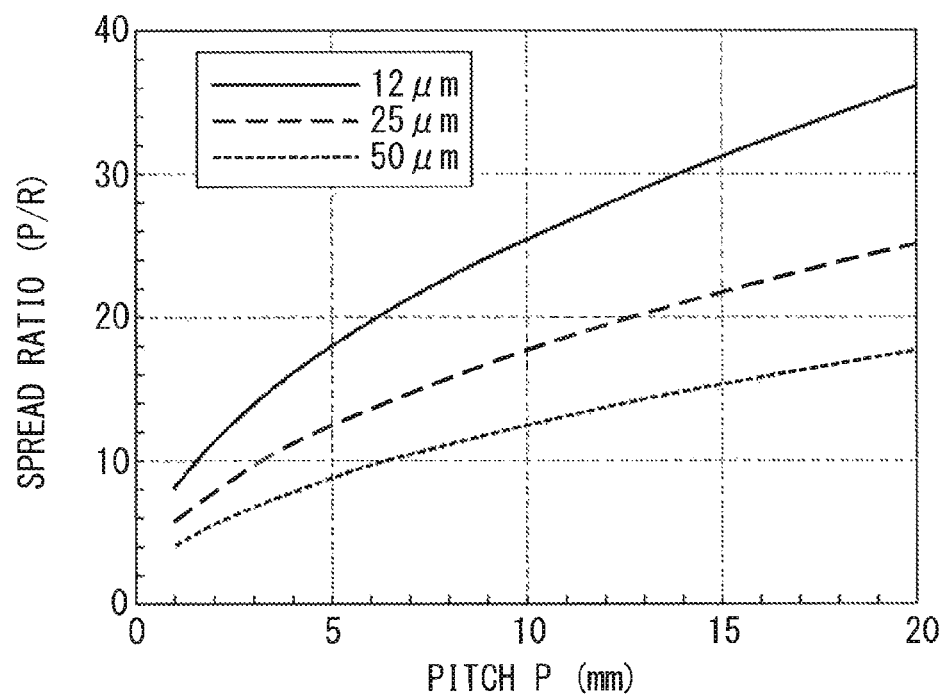
FIG. 9 A diagram illustrating the relationship between the application conditions and the spread of the applied material.

FIG. 9 illustrates the relationship between the application conditions and the spread. In the figure, the horizontal axis represents the pitch P, and the vertical axis represents the spread ratio (P/R). The application conditions were the same as those in FIG. 8. The actual sticking substrates is the operation of spreading the spread width 4R following application until the pitch P is reached, and this ratio P/4R is preferably at least 2 but not more than 8, and optimally at least 3 but not more than 6. If this ratio is less than this range, then the application time lengthens, whereas if the ratio is greater than this range, the sticking substrates load increases. Accordingly, the spread ratio (P/R) is preferably at least 8 but not more than 32, and optimally at least 12 but not more than 24. For example, when the sealing thickness is 25 µm, if the spread ratio P/R is set within the range from at least 12 to not more than 24, then the optimal pitch P is within a range from 4.5 mm to 18 mm, and based on FIG. 8, it is evident that this pitch range yields an optimal application diameter R of 0.4 mm to 0.8 mm.

(Modified Example of First Embodiment)

Figure 10:
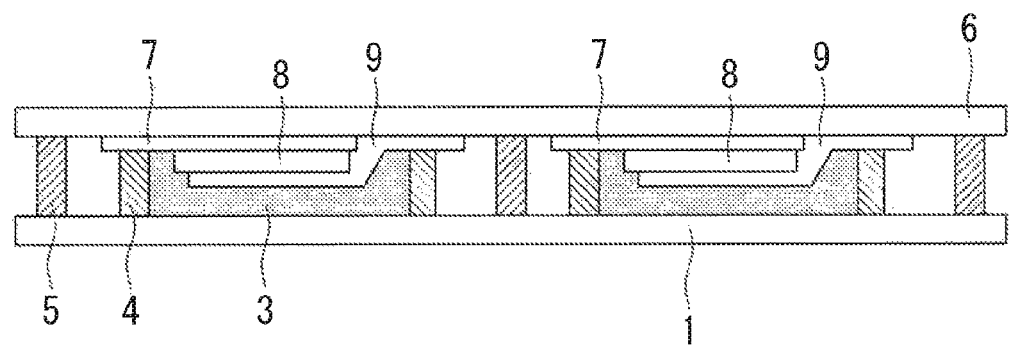
FIG. 10 A cross-sectional view of an organic EL panel following sealing according to a modified example of the first embodiment.

The method for producing an organic EL panel according to this modified example uses a desiccant as the filler. Those items for which no description is provided are deemed to be the same as the first embodiment. FIG. 10 illustrates a cross-sectional view of an organic EL panel following sealing according to this modified example.

The desiccant 3 is used as the filler in this modified example. The filler is composed of a medium such as a curable resin, a non-curable resin, a gel-like resin or a high-viscosity oil which contains a desiccant in a weight ratio of at least 10% but not more than 50%. The filler is preferably the same material as the desiccant. A zeolite or calcium oxide is suitable as the desiccant. The desiccant is composed of microparticles that are significantly smaller than the thickness of the sealing layer. The particle size of the desiccant is typically not more than 4 µm, and preferably 1 µm or smaller. The viscosity of the filler is preferably within a range from 10 Pa·s to 100 Pa·s.

The filler is applied to positions on the encapsulation substrate opposing the positions of the organic EL elements. As described in the first embodiment, the sealing thickness is from 10 µm to 100 µm. Because the desiccant contained in the filler is composed of microparticles that are significantly smaller than this sealing thickness, the filler does not cause faults such as the occurrence of leakage current or shorting as a result of changes in the sealing thickness either upon sticking substrates during sealing, or when a localized concentrated load is applied following completion of the panel.

(Second Embodiment)

Figure 11:
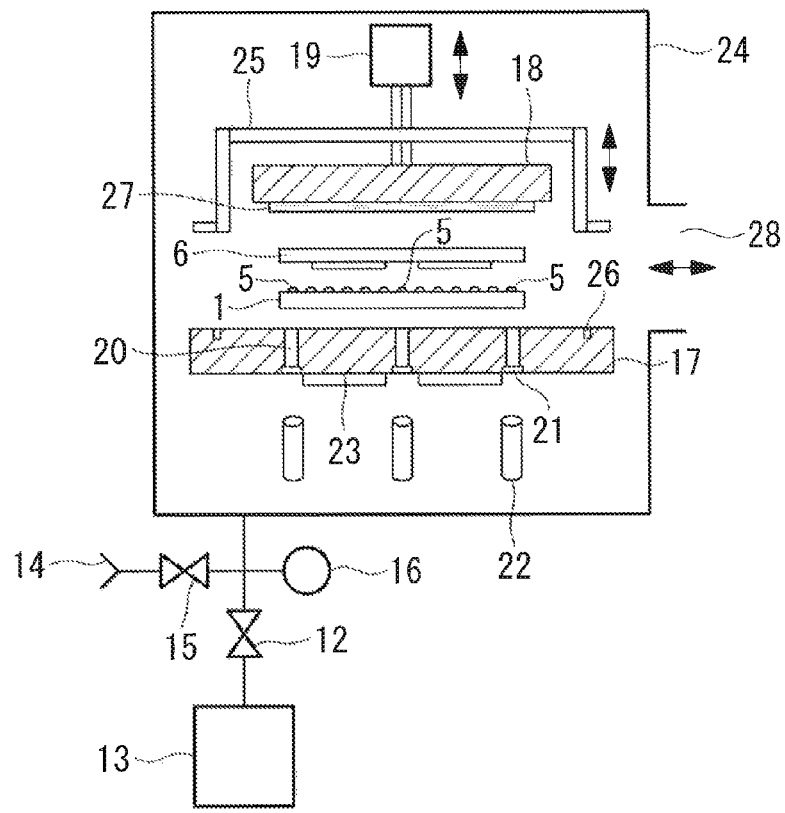
FIG. 11 A schematic cross-sectional view of a sealing device according to a second embodiment.

A feature of this embodiment is the addition of an inner chamber and an elastic sheet to the structure of the sealing device of the first embodiment. Those items for which no description is provided are deemed to be the same as the first embodiment. FIG. 11 illustrates a schematic cross-sectional view of the sealing device according to this embodiment.

A bonding chamber 24 is not a vacuum chamber, and is composed of an airtight chamber such as a glove box. A gas circulation and purification mechanism (not shown in the figure) is connected to the bonding chamber 24, and can ensure a dry environment with minimal moisture inside the bonding chamber. The bonding chamber 24 is connected in an open state, with no gate valve, to a transport chamber. The bonding chamber 24 is equipped with an inner chamber 25 which functions as the airtight sealing means. The inner chamber 25 is connected to the lift mechanism 19 of the upper surface plate 18 so as to be capable of housing the upper surface plate 18, the element substrate 6 and the encapsulation substrate 1. The inner chamber 25 is lowered together with the upper surface plate 18, and makes contact with the lower surface plate 17. A vacuum seal 26 is disposed on the portion of the lower surface plate 17 which makes contact with the inner chamber 25, and the inner chamber 25 and the lower surface plate 17 can form an airtight space. In other words, the inner chamber 25 can isolate the space in which the bonding is actually performed from the external environment.

The exhaust valve 12 and the vacuum pump 13 are connected to the inner chamber 25 as the evacuation means. The evacuation means can evacuate the inside of the bonding chamber. Further, the vent gas 14, the vent valve 15 and the pressure gauge 16 are connected to the inner chamber 25 as the gas introduction means. The gas introduction means can control the pressure inside the inner chamber by introducing an inert gas while detecting the internal pressure with the pressure gauge 16. The vent gas 14 is an inert gas having a moisture content lower than a prescribed value. For example, the vent gas 14 may be nitrogen gas having a moisture concentration of 1 ppm or less.

The UV transmission holes 20 which penetrate through the lower surface plate 17 are provided in the lower surface plate 17. The UV transmission holes 20 are disposed appropriately in positions which enable selective irradiation of the fixing agent 5 with ultraviolet rays. UV transmission windows 21 are provided in the rear surface side of the lower surface plate at the ends of the UV transmission holes 20. The spot-like ultraviolet lamps 22 are located inside the bonding chamber, and are disposed in positions which enable ultraviolet rays to be irradiated from the rear surface side of the lower surface plate 17, through the UV transmission windows 21, and onto the fixing agent 5. The provisional fixing means comprising the UV transmission holes 20, the UV transmission windows 21 and the spot-like ultraviolet lamps 22 may also be positioned on the side of the upper surface plate.

In FIG. 11, the lower surface plate 17 functions as the bottom surface of the inner chamber 25, but a separate inner chamber may also be provided. In that case, the inner chamber has a structure that also houses the lower surface plate 17. Further, the UV transmission windows 21 may be provided in positions inside the inner chamber that enable the fixing agent to be irradiated with ultraviolet rays through the UV transmission holes 20.

An elastic sheet 27 is provided on the upper surface plate 18 on the surface facing the element substrate. The thickness of the elastic sheet 27 is preferably from 0.1 mm to 1 mm. The elastic sheet 27 is formed from a slightly conductive antistatic material.

The conductive antistatic material is preferably a material having a surface resistance of not more than $10^{10}$ Ω/square and a volume resistivity of not more than $10^{12}$ Ω·m, and in the case of a sheet, preferably has a resistance between the upper surface and the lower surface of not more than $10^{10}$Ω. In this embodiment, an antistatic polyethylene porous film (Sunmap, manufactured by Nitto Denko Corporation) with a thickness of 0.5 mm was used.

The surface plates are subjected to planarization by polishing, but the processing limit is a degree of flatness of approximately 5 μm. With surface plates for larger substrates, this degree of flatness deteriorates further. Even for a small substrate, if the sealing thickness is thin, then the degree of flatness of the surface plates has an effect on fluctuations in the sealing thickness. In the present embodiment, by disposing the slightly conductive antistatic elastic sheet 27 on the upper surface plate, any deviations in the degree of flatness of the upper and lower surface plates can be absorbed. Specifically, by ensuring that the thickness of the elastic sheet 27 satisfies the range described above, a degree of flatness of several μm to several tens of μm can be absorbed. As a result, the sealing thickness can be made more uniform.

Further, glass is generally used for the element substrate 6, and if the elastic sheet 27 is insulating, then electrostatic charging occurs upon peeling, meaning the bonded substrates are electrostatically attracted to the upper surface plate, and become difficult to detach.

In the present embodiment, the element substrate 6 having the organic EL elements formed thereon, and the encapsulation substrate 1 to which the filler 2, the desiccant 3, the sealant 4 and the fixing agent 5 have been applied are transported in through a substrate transport port 28. Following positioning of each of the substrates, the inner chamber 25 and the upper surface plate 18 are lowered, and the inner chamber 25 contacts the upper surface plate 18 in a position where the upper surface plate 18 has not yet contacted the element substrate 6, with the vacuum seal 26 causing airtight sealing. Subsequently, evacuation and pressure adjustment are performed in the same manner as the first embodiment, and the upper surface plate 18 is then lowered using the lift mechanism 19 to perform sticking substrates of the element substrate 6 and the encapsulation substrate 1. Following returning of the inside of the inner chamber to atmospheric pressure, the fixing agent 5 is UV cured using the spot-like ultraviolet lamps 22. The upper surface plate 18 and the inner chamber 25 are then raised, and the bonded substrates are transported out through the substrate transport port 28.

According to the present embodiment, because the inside of the bonding chamber 24 is a dry environment that is not placed under vacuum, the lift mechanism 19 and the spot-like ultraviolet lamps 22 can be installed inside the bonding chamber.

According to the present embodiment, by providing the inner chamber 25, the volume that must be evacuated can by limited to only the volume required for the bonding process. As a result, the time required for evacuation and venting can be shortened, thus improving the productivity.

According to the present embodiment, by providing the elastic sheet 27, a uniform sealing thickness can be ensured even when the sealing thickness is quite thin, or when the substrates have a large surface area. As a result, the quality and yield of the organic EL panel can be improved.

(Third Embodiment)

Figure 12:
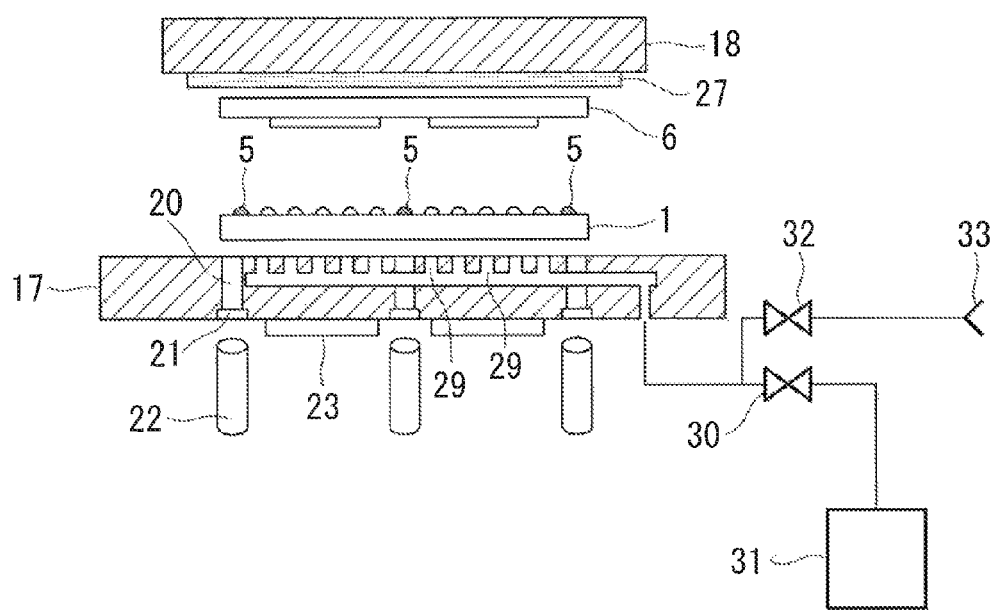
FIG. 12 A schematic cross-sectional view of a sealing device according to a third embodiment.

A feature of this embodiment is the addition of a vacuum suction mechanism to the structure of the sealing device of the second embodiment. Those items for which no description is provided are deemed to be the same as the second embodiment. FIG. 12 illustrates a schematic cross-sectional view of the sealing device. In this figure, the bonding chamber, the airtight sealing means, the evacuation means and the gas introduction means are omitted.

The vacuum suction mechanism comprises vacuum suction holes 29, a suction valve 30, a vacuum suction pump 31, a suction release valve 32, and a release gas 33.

The vacuum suction holes 29 are provided in the lower surface plate 17, and include a plurality of openings which open toward the surface of the lower surface plate 17 facing the encapsulation substrate. Each of the plurality of openings is connected to the vacuum suction pump 31 via the suction valve 30. Further, each of the plurality of openings is also connected to the release gas 33 via the suction release valve 32. An example of the release gas 33 is a nitrogen gas having a moisture concentration of 1 ppm or less.

Furthermore, the porous elastic sheet described in the second embodiment may also be used on the suction surface, thereby further facilitating the vacuum suction.

In this embodiment, following transport of the encapsulation substrate into the bonding chamber and positioning of the substrate on the lower surface plate, the suction valve 30 is opened, and the encapsulation substrate 1 is suctioned against the lower surface plate 17 using the vacuum suction pump 31. Subsequently, the element substrate 6 is transported into the bonding chamber and positioned. Then, the steps from the defoaming step onward are performed in the same manner as the second embodiment. In other words, the suction valve 30 is closed, defoaming is performed by evacuation, pressure adjustment is performed, and the substrates are pressure welded together. Next, the substrates are returned to atmospheric pressure in the gas introduction step, and at the same time, the suction release valve 32 is opened, and sufficient release gas 33 is introduced to return the pressure to atmospheric pressure, thereby releasing the suction on the encapsulation substrate 1. Subsequently, the upper surface plate 18 is raised, and the bonded substrates are transported out.

According to this embodiment, because the lower surface plate 17 is heated in advance by the heating means 23, the encapsulation substrate 1 adheres well to the lower surface plate 17. As a result, the heat conduction efficiency from the surface plate to the encapsulation substrate 1 improves, enabling the filler 2 and the like to be heated thoroughly in a short period of time. As a result, the productivity of the organic EL panel improves. Further, because the viscosity of the filler 2 and the like can be lowered satisfactorily prior to sticking substrates, stress on the elements can be reduced, thereby improving the quality and the yield.

Similar effects can also be obtained by combining the present embodiment with the first embodiment.

(Fourth Embodiment)

Figure 13:
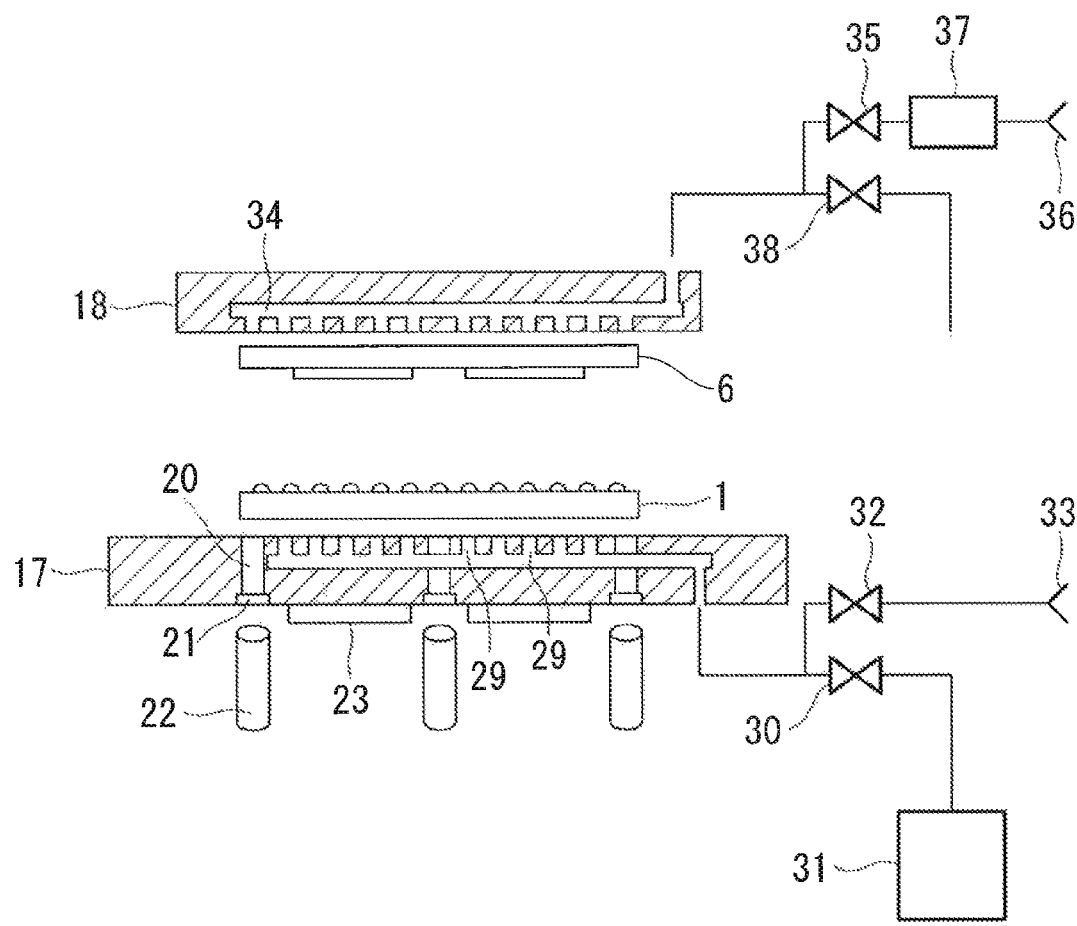
FIG. 13 A schematic cross-sectional view of a sealing device according to a fourth embodiment.

A feature of this embodiment is the addition of a gas pressurization mechanism and a gas pressure adjustment mechanism to the structure of the sealing device of the first embodiment. Further, the sealing device according to this embodiment may also include the same vacuum suction mechanism as the third embodiment. Those items for which no description is provided are deemed to be the same as the first embodiment. FIG. 13 illustrates a schematic cross-sectional view of the sealing device according to this embodiment. In this figure, the bonding chamber, the airtight sealing means, the evacuation means and the gas introduction means are omitted.

The gas pressurization mechanism comprises upper surface plate holes 34, a discharge valve 35, and a pressurizing gas 36. The upper surface plate holes 34 are provided in the upper surface plate 18, and include a plurality of openings which open toward the surface of the upper surface plate 18 facing the element substrate. Each of the plurality of openings is connected to the pressurizing gas 36 via the discharge valve 35. A pressure control unit 37 is provided as the gas pressure adjustment mechanism between the discharge valve 35 and the pressurizing gas 36. An example of the pressurizing gas 36 is a nitrogen gas having a moisture concentration of 1 ppm or less. Further, each of the plurality of openings may also be connected to a vacuum suction pump 31 via a suction valve 38. The vacuum suction pump may be the same pump as that used for the vacuum suction mechanism of the lower surface plate.

In this embodiment, following transport of the encapsulation substrate 1 into the bonding chamber and positioning of the substrate on the lower surface plate, the suction valve 30 is opened, and the encapsulation substrate 1 is suctioned against the lower surface plate 17 using the vacuum suction pump 31. Next, the element substrate 6 is transported into the bonding chamber, positioned, and then held in position. Subsequently, the vacuum suction valve 30 is closed, defoaming is performed, a pressure adjustment is performed, and the upper surface plate 18 is then lowered to pressure weld the substrates together.

Next, the substrates are returned to atmospheric pressure in the gas introduction step. At this time, with the pressure welded state maintained, the discharge valve 35 is opened, and the pressurizing gas 36, which has been adjusted to a prescribed pressure by the pressure control unit, is discharged from the upper surface plate holes 34. As a result, a gas layer is formed between the upper surface plate 18 and the element substrate 6.

For example, in the case where the sticking substrates of the substrates has been performed using a load of 10 kPa from the upper surface plate 18, if a gas having a pressure 10 kPa higher than the pressure inside the bonding chamber is introduced by the gas pressurization mechanism, then the upper surface plate 18 floats slightly upward, and the gas escapes from the gap around the outer periphery of the element substrate 6. The gap between the element substrate 6 and the floating upper surface plate 18 is filled by the pressurized gas, enabling a load similar to the load of the upper surface plate 18 to press down on the surface of the element substrate 6 with a uniform pressure. In the first embodiment through to the third embodiment, the pressurization points of the upper surface plate 18 are at the center of the surface plate, but in the present embodiment, the pressurization points can be adjusted to the periphery of the upper surface plate. Particularly in the case of large substrates, the pressurization points of the surface plate are preferably around the periphery of the surface plate.

Moreover, by also using the porous elastic sheet described in the second embodiment, the sealing properties of the pressurizing gas can be improved, thereby yielding more uniform pressurization.

Subsequently, in the state where this layer of gas has been generated, ultraviolet rays are irradiated onto the fixing agent 5, thereby provisionally fixing the pressure welded substrates. Subsequently, the discharge valve 35 is closed, the upper surface plate 18 is raised, and the bonded substrates are transported out of the chamber.

Further, the upper surface plate holes 34 are similar to the vacuum suction mechanism, and by connecting the vacuum suction valve 38 to the vacuum suction pump 31, when the element substrate 6 is transported into the chamber, it can be suctioned against the upper surface plate 18. As a result, the element substrate 6 can be suctioned against the upper surface plate 18. However, this vacuum suction function can only be used until the defoaming step when the bonding chamber is evacuated.

According to this embodiment, because the surface plate on the element side is also provided with a similar mechanism to the vacuum suction mechanism, by discharging a pressure-regulated gas from the surface plate, a uniform load per unit of surface area can be applied to the element substrate in accordance with Pascal's principle. As a result, sticking substrates can be performed with absorption of any undulations in the substrate or the surface plate, meaning a uniform sealing thickness can be obtained, and yielding improvements in the quality and the yield of the organic EL panel. The present embodiment is particularly appropriate when the substrates are large.

REFERENCE SIGNS LIST

1 Encapsulation substrate
2 Filler
3 Desiccant
4 Sealant
5 Fixing agent
6 Element substrate
7 Anode
8 Organic light emitting layer
9 Cathode
10, 24 Bonding chamber
11 Gate valve 12 Exhaust valve
13 Vacuum pump
14 Vent gas
15 Vent valve
16 Pressure gauge
17 Lower surface plate
18 Upper surface plate
19 Lift mechanism
20 UV transmission hole
21 UV transmission window
22 Spot-like ultraviolet lamp
23 Surface heater
25 Inner chamber
26 Vacuum seal
27 Elastic sheet
28 Substrate transport port
29 Vacuum suction hole
30, 38 Suction valve
31 Vacuum suction pump
32 Suction release valve
33 Release gas
34 Upper surface plate hole
35 Discharge valve
36 Pressurizing gas
37 Pressure control unit

The invention claimed is:

1. A method for producing an organic EL panel in which a sealing layer is interposed with no gaps between an element substrate on which an organic EL element is formed and a flat encapsulation substrate, the method comprising:
an application step of independently applying a filler, a desiccant, a sealant which is composed of an ultraviolet-curable resin and is disposed so as to surround the filler and the desiccant, and a fixing agent composed of an ultraviolet-curable resin to positions on the encapsulation substrate opposing the position of the organic EL element in an inert environment in which the moisture content is less than a prescribed value,
a positioning step of transporting the element substrate and the encapsulation substrate to a bonding chamber, and positioning the element substrate and the encapsulation substrate in mutually separated positions,
a heating in advance step of heating at least one of a pair of surface plates formed of metal by heating means,
a heating step of heating the encapsulation substrate to which the filler, the desiccant, the sealant and the fixing agent have been applied by the heated surface plate in the heating in advance step,
a defoaming step of placing an inside of the bonding chamber under vacuum, and removing gases incorporated within the filler, the desiccant, the sealant and the fixing agent,
a sticking substrates step of sandwiching the element substrate and the encapsulation substrate between the pair of surface plates, applying a prescribed load to the pair of surface plates to pressure weld the element substrate and the encapsulation substrate together, and controlling the load so that an internal region surrounded by the sealant is filled with the filler and the desiccant, thus forming a sealing layer of a prescribed thickness between the element substrate and the encapsulation substrate,
a gas introduction step of introducing an inert gas into the bonding chamber, and returning a periphery around the pressure welded element substrate and encapsulation substrate to an atmospheric pressure environment,
a provisional fixing step of irradiating ultraviolet rays from a rear surface of the surface plate on a side of the encapsulation substrate onto the fixing agent using a spot-type ultraviolet lamp after the gas introduction step, through UV transmission holes which penetrate through the surface plate and which are provided in at least one of the pair of the surface plates, thereby curing the fixing agent and provisionally fixing the element substrate and the encapsulation substrate, and
a seal curing step of irradiating ultraviolet rays onto the sealant applied to the substrates that have been provisionally fixed in the provisional fixing step, thereby curing the sealant.

2. The method for producing an organic EL panel according to claim 1, further comprising a pressure adjustment step of introducing an inert gas into the bonding chamber, and adjusting the pressure inside the bonding chamber to a value of at least 50 Pa but not more than 500 Pa in order to eliminate foaming of the filler, the desiccant, the sealant and the fixing agent, wherein the sticking substrates step is performed after the pressure adjustment step.

3. The method for producing an organic EL panel according to claim 1, wherein in the application step,
a desiccant comprising at least 10% by weight but not more than 50% by weight of a zeolite or calcium oxide having a particle size of not more than 4 μm in a resin or a high-viscosity oil, and having a viscosity at room temperature of at least 10 Pa·s but not more than 100 Pa·s, is used as the desiccant.

4. The method for producing an organic EL panel according to claim 1, wherein in the application step,
a filler having a viscosity at room temperature of at least 10 Pa·s but not more than 100 Pa·s is applied as intermittent straight lines which are applied in parallel with a spacing therebetween, or as a helical shape with an equal spacing therein.

5. The method for producing an organic EL panel according to claim 1, wherein in the application step,
the filler is applied so that a spread ratio P/R between a diameter R of an applied bead of the filler and an application pitch P is within a range from at least 8 to not more than 32.

6. The method for producing an organic EL panel according to claim 1, wherein in the application step,
the desiccant is applied in a position such that a spread width of the desiccant following sticking substrates is within a region from an inner peripheral edge of the sealant to an outer peripheral edge of light emission from the organic EL element.

7. The method for producing an organic EL panel according to claim 1, wherein in the application step, a desiccant is used as the filler.

8. The method for producing an organic EL panel according to claim 1, wherein in the application step, a sealant composed of an ultraviolet-curable epoxy resin comprising a spacer of at least 10 μm but not more than 100 μm is applied so as to surround an outer periphery of a light emission surface of the organic EL element, thereby specifying a spacing between the element substrate and the encapsulation substrate in the sticking substrates step.

9. The method for producing an organic EL panel according to claim 1, wherein in the application step, a fixing agent composed of an ultraviolet-curable resin comprising a spacer of at least 10 μm but not more than 100 μm is applied intermittently around a periphery of a light emission surface of the organic EL element or around a periphery of the element substrate, thereby specifying a spacing between the element substrate and the encapsulation substrate in the sticking substrates step.

10. The method for producing an organic EL panel according to claim 1, wherein a temperature of the encapsulation substrate in the heating step is controlled within a range from at least 40° C. to not more than 80° C.

11. A device for sealing an organic EL panel in which a sealing layer is interposed with no gaps between an element substrate on which an organic EL element is formed and a flat encapsulation substrate, the device comprising:
   an application means which applies a filler, a desiccant and a sealant which constitute a sealing layer, and a fixing agent to the encapsulation substrate with a dispenser,
   an airtight sealing means which can isolate a bonding chamber from an external environment,
   an evacuation means which evacuates an inside of the bonding chamber,
   a gas introduction means which can control a pressure inside the bonding chamber by introducing an inert gas,
   a positioning means which positions the element substrate and the encapsulation substrate in mutually separated positions,
   a heating means which heats the encapsulation substrate to which the filler, the desiccant, the sealant and the fixing agent have been applied,
   a sticking substrates means which is composed of a pair of metal surface plates, and can control a load under a vacuum environment, wherein a UV transmission hole is provided in at least one of the pair of the metal surface plates, the UV transmission hole penetrates through the at least one of the pair of the metal surface plates,
   a provisional fixing means which provisionally fixes the element substrate and the encapsulation substrate by disposing a spot-type ultraviolet lamp at a rear surface of the metal surface plate on a side of the encapsulation substrate and curing the fixing agent by irradiation with ultraviolet rays through the UV transmission hole, and
   a seal curing means which cures the sealant by irradiation with ultraviolet rays,
   wherein the airtight sealing means has, inside the bonding chamber, an inner chamber which can house and seal only the metal surface plates, the element substrate and the encapsulation substrate therewithin, and
   wherein, after performing sticking of the element substrate and the encapsulation substrate, the element substrate and the encapsulation substrate are stuck together and transported out of the inner chamber under atmospheric pressure.

12. The device for sealing an organic EL panel according to claim 11, wherein the heating means comprises a surface heater and a thermocouple disposed on a rear surface of the metal surface plate on a side of the encapsulation substrate, and can control the temperature of the encapsulation substrate at a desired temperature.

13. The device for sealing an organic EL panel according to claim 11, wherein the sticking substrates means comprises an elastic sheet, which is disposed on a substrate-side surface of the surface plate on a side of the element substrate and which covers an entire metal-surface-plate side surface of the element substrate, has a thickness of at least 0.1 mm but not more than 1.0 mm, and exhibits conductivity.

14. The device for sealing an organic EL panel according to claim 11, wherein the sticking substrates means comprises a vacuum suction mechanism disposed on the surface plate on a side of the encapsulation substrate.

15. The device for sealing an organic EL panel according to claim 11, wherein the sticking substrates means comprises a gas pressurization mechanism and a gas pressure adjustment mechanism disposed on the surface plate on a side of the element substrate.

* * * * *